United States Patent
Honma et al.

(10) Patent No.: US 10,700,267 B2
(45) Date of Patent: Jun. 30, 2020

(54) MAGNETORESISTIVE ELEMENT, MANUFACTURING METHOD THEREOF AND MAGNETIC SENSOR

(71) Applicant: TDK Corporation, Tokyo (JP)

(72) Inventors: Kohei Honma, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/163,703

(22) Filed: Oct. 18, 2018

(65) Prior Publication Data
US 2019/0148626 A1  May 16, 2019

(30) Foreign Application Priority Data

Nov. 13, 2017 (JP) .................. 2017-217986
Aug. 30, 2018 (JP) .................. 2018-161738

(51) Int. Cl.
| | |
|---|---|
| H01L 43/08 | (2006.01) |
| H01L 43/10 | (2006.01) |
| G01R 33/09 | (2006.01) |
| H01L 27/22 | (2006.01) |
| H01L 43/12 | (2006.01) |

(52) U.S. Cl.
CPC ............ *H01L 43/08* (2013.01); *G01R 33/098* (2013.01); *H01L 27/22* (2013.01); *H01L 43/10* (2013.01); *H01L 43/12* (2013.01)

(58) Field of Classification Search
CPC ......... H01L 43/08; H01L 43/10; H01L 43/12; H01L 27/22; G01R 33/098
USPC ......... 257/421, 425, 427, E27.005, E27.104, 257/E29.323, E43.004, E43.005, E43.006; 360/324.2, 324, 319, 313, 75; 438/765, 438/127, 73, 3
See application file for complete search history.

(56) References Cited

U.S. PATENT DOCUMENTS

| | | | |
|---|---|---|---|
| 2007/0053114 A1* | 3/2007 | Uesugi ................ | B82Y 10/00 360/324.2 |
| 2011/0134563 A1* | 6/2011 | Komagaki ............ | B82Y 10/00 360/75 |
| 2012/0091548 A1 | 4/2012 | Sukegawa et al. | |
| 2012/0241879 A1 | 9/2012 | Ikeno et al. | |
| 2013/0221461 A1* | 8/2013 | Sukegawa ............... | H01L 43/08 257/421 |
| 2015/0318466 A1* | 11/2015 | Shimane ........... | H01L 21/67109 438/765 |

(Continued)

FOREIGN PATENT DOCUMENTS

| | | |
|---|---|---|
| JP | 2007-048972 A | 2/2007 |
| JP | 5294043 B2 | 6/2012 |

(Continued)

*Primary Examiner* — Dao H Nguyen
(74) *Attorney, Agent, or Firm* — Posz Law Group, PLC

(57) ABSTRACT

A magnetoresistive element has a magnetization free layer whose magnetization direction changes in an external magnetic field; a magnetization pinned layer whose magnetization direction is pinned in the external magnetic field; and a barrier layer that is positioned between the magnetization free layer and the magnetization pinned layer and that exhibits a magnetoresistive effect. The barrier layer is an oxide of an alloy that includes Mg and Al, and the barrier layer includes a crystalline region and a non-crystalline region.

10 Claims, 7 Drawing Sheets

(56) References Cited

U.S. PATENT DOCUMENTS

2018/0083186 A1   3/2018   Sasaki et al.
2019/0036016 A1   1/2019   Sasaki et al.

FOREIGN PATENT DOCUMENTS

JP   2012-204432 A    10/2012
WO   2016/158867 A1   10/2016

* cited by examiner

MAGNETORESISTIVE ELEMENT, MANUFACTURING METHOD THEREOF AND MAGNETIC SENSOR

BACKGROUND OF THE INVENTION

Field of the Invention

The present application is based on, and claims priority from, JP Application No. 2017-217986, filed on Nov. 13, 2017 and JP Application No. 2018-161738, filed on Aug. 30, 2018, the disclosure of which is hereby incorporated by reference herein in its entirety.

The present invention relates to a magnetoresistive element, manufacturing method thereof and a magnetic sensor, and particularly to the configuration of a barrier layer of the magnetoresistive element.

Description of the Related Art

In a magnetic sensor having a magnetoresistive element, the magnetoresistive element is formed as a CIP (Current-In-Plane)-GMR (Gigantic Magnetoresistive) element, an AMR (Anisotropic Magnetoresistive) element and so on. JP5294043, JP5586028 and JP5988019 disclose a magnetoresistive element using a TMR (Tunnel Magnetoresistance) element that exhibits a relatively high MR ratio. A magnetoresistive element using a TMR element is typically constructed as a multilayer film that includes a magnetization free layer whose magnetization direction changes depending on an external magnetic field, a magnetization pinned layer whose magnetization direction is pinned against the external magnetic field and a barrier layer that is positioned between the magnetization free layer and the magnetization pinned layer and that exhibits a magnetoresistive effect. The barrier layer is typically formed of a metal oxide, especially of MgO that is capable of obtaining a high MR ratio that exceeds 100%.

SUMMARY OF THE INVENTION

In general, the electric resistance of a magnetic sensor has to be kept within a desired range. In a magnetic sensor using a TMR element, the electric resistance of the circuit is mainly determined by the tunneling resistance of the TMR element. Thus, it is important to accurately manage the tunneling resistance value of the TMR element in the manufacturing process. A barrier layer that consists of MgO may be formed by depositing a Mg film by means of sputtering and then by oxidizating the Mg film. However, a Mg film, when oxidized, tends to form passivity on the surface thereof and to leave inside of the Mg film under-oxidized.

The electric resistance of a TMR element can be approximated by an exponential, which is a function of the film thickness of the barrier layer, the tunnel barrier height of the barrier layer and so on. The tunnel barrier height is a variable that depends on material and is largely changed, for example, depending on the ratio of under-oxidized Mg that remains inside of the barrier layer. Therefore, the tunnel barrier height is changed due to variation of the manufacturing process, and accordingly, the electric resistance of the TMR element, which is approximated by the exponential of the tunnel barrier height, is also largely changed. Since TMR elements are manufactured in a wafer process, the variation in oxidization of a Mg film leads to a wafer level variation in the electric resistance of TMR elements. This becomes a big problem on yield and quality control of magnetic sensors.

The present invention aims at providing a magnetoresistive element having a high MR ratio and a barrier layer having reduced variation in electric resistance.

A magnetoresistive element of the present invention comprises: a magnetization free layer whose magnetization direction changes in an external magnetic field; a magnetization pinned layer whose magnetization direction is pinned in the external magnetic field; and a barrier layer that is positioned between the magnetization free layer and the magnetization pinned layer and that exhibits a magnetoresistive effect. The barrier layer is an oxide of an alloy that includes Mg and Al, and the barrier layer includes a crystalline region and a non-crystalline region.

An alloy film that includes Mg and Al is more apt to be oxidized in the inside of the film than a Mg film. This means higher repeatability in oxidization and less variation between wafers. Such a barrier layer includes a crystalline region and a non-crystalline region. Thus, according to the present invention, it is possible to provide a magnetoresistive element having a high MR ratio and a barrier layer having reduced variation in electric resistance.

The above and other objects, features and advantages of the present invention will become apparent from the following description with reference to the accompanying drawings which illustrate examples of the present invention.

DETAILED DESCRIPTION OF EMBODIMENTS

Hereinafter, an embodiment of a magnetoresistive element of the present invention will be described with reference to the drawings. In the following description, the X direction is a direction in which the magnetoresistive element detects magnetic field. The Y direction is orthogonal to the X direction. The X and Y directions are parallel to the mounting surface of the magnetoresistive element. The Z direction is orthogonal to the X and Y directions and corresponds to a direction in which a plurality of layers that constitute the magnetoresistive element are stacked.

Figure 1:
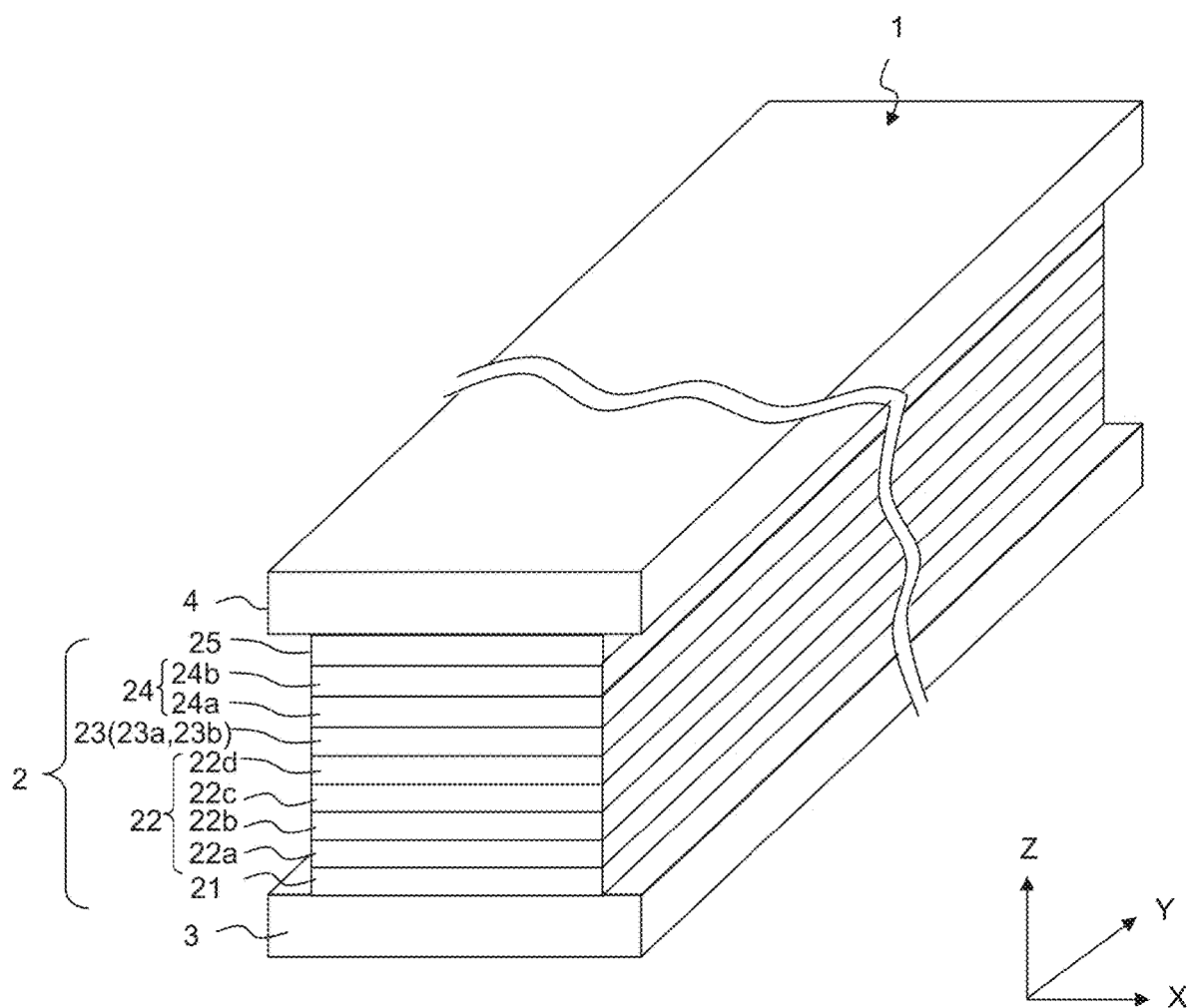
FIG. 1 is a schematic perspective view of a magnetoresistive element according to an embodiment of the present invention.

FIG. 1 is a sectional view schematically showing the configuration of a magnetoresistive element. Magnetoresistive effect element 1 has MTJ (magnetic tunnel junction) 2 and a pair of lead electrodes 3, 4 that interpose MTJ 2 in the Z direction. MTJ 2 has magnetization free layer 24, magnetization pinned layer 22 and barrier layer 23 that is interposed between magnetization free layer 24 and magnetization pinned layer 2 and that has a magnetoresistive effect. Thus, magnetoresistive element 1 according to the present embodiment is a TMR element. Magnetization free layer 24 is formed of a soft magnetic body, such as CoFe, and the magnetization direction changes depending on an external magnetic field in a plane that includes the X and Y directions. In the present embodiment, magnetization free layer 24 consists of first magnetization free layer 24a that is formed of CoFe and second magnetization free layer 24b that is formed of CoFeB. Magnetization free layer 24 is sufficiently longer in the Y direction than in the X direction, and the magnetization direction is directed in the Y direction due to the shape anisotropy thereof when there is no external magnetic field or there is only a weak external magnetic field. Bias magnetic layers that are formed of hard magnetic bodies may be provided on both sides of magnetization free layer 24 with regard to the Y direction in order to direct the magnetization direction in the Y direction. The magnetization direction of magnetization pinned layer 22 is pinned against the external magnetic field.

Magnetization pinned layer 22 is a multilayer film in which first magnetization pinned layer 22a, nonmagnetic intermediate layer 22b, second magnetization pinned layer 22c and thin CoFe layer 22d that faces barrier layer 23 are sequentially stacked. MR ratio can be enhanced by providing CoFe layer 22d as compared to an arrangement in which second magnetization pinned layer 22c is directly connected to barrier layer 23. CoFe layer 22d may also be omitted. First magnetization pinned layer 22a and second magnetization pinned layer 22c are formed of soft magnetic bodies, such as CoFe, and nonmagnetic intermediate layer 22b is formed of Ru, Rh, Ir or an alloy thereof. First magnetization pinned layer 22a and second magnetization pinned layer 22c are anti-ferromagnetically coupled to each other via nonmagnetic intermediate layer 22b. Anti-ferromagnetic layer 21 is provided under first magnetization pinned layer 22a. Anti-ferromagnetic layer 21 is formed of IrMn or the like and is exchange-coupled to first magnetization pinned layer 22a. Magnetization free layer 24 is covered with protection layer 25 that is formed of Ta or the like. Second magnetization pinned layer 22c that is adjacent to barrier layer 23 via CoFe layer 22d, second magnetization free layer 24b or both second magnetization pinned layer 22c and second magnetization free layer 24b includes Co and Fe and may further include at least any one of Si, B, N and P. MR ratio can be further enhanced by adding any one of Si, B, N and P. In addition, second magnetization pinned layer 22c and second magnetization free layer 24b are crystallized by annealing in the manufacturing process. It is desirable that at least a portion of second magnetization pinned layer 22c that is adjacent to the boundary between second magnetization pinned layer 22c and CoFe layer 22d be crystallized in order to form an atomic arrangement with periodic continuity from the portion to CoFe layer 22d. It is also desirable that the boundary portion between second magnetization free layer 24b and first magnetization free layer 24a be crystallized in the same manner. Further, it is also desirable that the boundary portion between CoFe layer 22d and barrier layer 23 and the boundary portion between first magnetization free layer 24a and barrier layer 23 be crystallized. Such crystallization enhances the MR ratio.

Lead electrodes 3, 4 supply sense current to MTJ 2. When the magnetization direction of magnetization free layer 24 and the magnetization direction of magnetization pinned layer 22 are anti-parallel to each other, the electric resistance of MTJ 2 to the sense current is maximized and the current that flows through MTJ 2 is minimized. On the other hand, when the magnetization direction of magnetization free layer 24 and the magnetization direction of magnetization pinned layer 22 are parallel to each other, the electric resistance of MTJ 2 is minimized and the current that flows through MTJ 2 is maximized. Accordingly, the strength and the direction of an external magnetic field can be detected from the change in the electric resistance (the change in voltage) of MTJ 2.

Barrier layer 23 is an oxide of an alloy that includes Mg and Al. The alloy consists of Mg and Al, but may include Zn and/or Ti in place of or in addition to Mg. This configuration prevents passivity of Mg from being generated in the oxidization process (described later) and promotes the formation of a mixture of poly-crystal and amorphism of barrier layer 23 (described later).

In contrast, a conventional barrier layer is formed, for example, of MgO that is capable of obtaining a high MR ratio. Explanation will be given about the problem of a barrier layer that is formed of MgO. A MgO barrier layer can be formed by oxidizing a Mg film that is deposited by means of sputtering or by directly depositing MgO by means of sputtering. The former is advantageous in that it can produce a TMR film having high reliability for voltage resistance, as compared to the method of directly depositing MgO by means of sputtering.

When the former method is adopted, it is important that the Mg film that is formed be oxidized to the inside of the film. In other words, since the tunneling effect is obtained by the tunnel barrier effect of MgO that is an insulator, if magnesium oxide that contains many oxygen defects due to shortage of oxygen remains in the barrier layer, then a desired tunneling effect will not be obtained. However, a Mg film tends to form passivity on the surface thereof when the film is oxidized and to limit the progress of the oxidation into the inside of the film. Here, the element electric resistance of a TMR element is substantially determined by the tunneling resistance of the barrier layer, and specifically there is the following relationship.

$$R \partial e^{\gamma \Phi t}$$

where R is the element resistance of the TMR element, $\gamma$ is a constant, t is the film thickness of the barrier layer, and $\Phi$ is the tunnel barrier height which depends on material. Thus, the electric resistance of a TMR element depends on the film thickness of the barrier layer and on the tunnel barrier height of the barrier layer (or the material of the barrier layer) in an exponential manner. The electric resistance R is changed by changing the process conditions of oxidization because the composition of the barrier layer is changed depending on the process conditions of oxidization and thereby tunnel barrier height $\Phi$ of the barrier layer is substantially changed. The characteristics of electric resistance R being changed in an exponential manner by the change of $\Phi$ is specific to a TMR element, and this is one of the reasons for the variation in the electric resistance of TMR elements. Since, the oxidization processes are carried out on wafer level, only a small amount of variation in the process conditions appears as a wafer level variation in the electric resistance of TMR elements. In contrast, in case of a CIP-GMR element and an AMR element, which are formed of a metal film alone, the electric resistance is substantially in inverse proportion to the sectional area of the element and in proportion to the length of the element. Accordingly, the variation in electric resistance and MR ratio substantially depends on the variation in the deposition rate alone. This means that the variation in characteristics that is caused by production processes is smaller than that of a TMR element.

Figure 2:
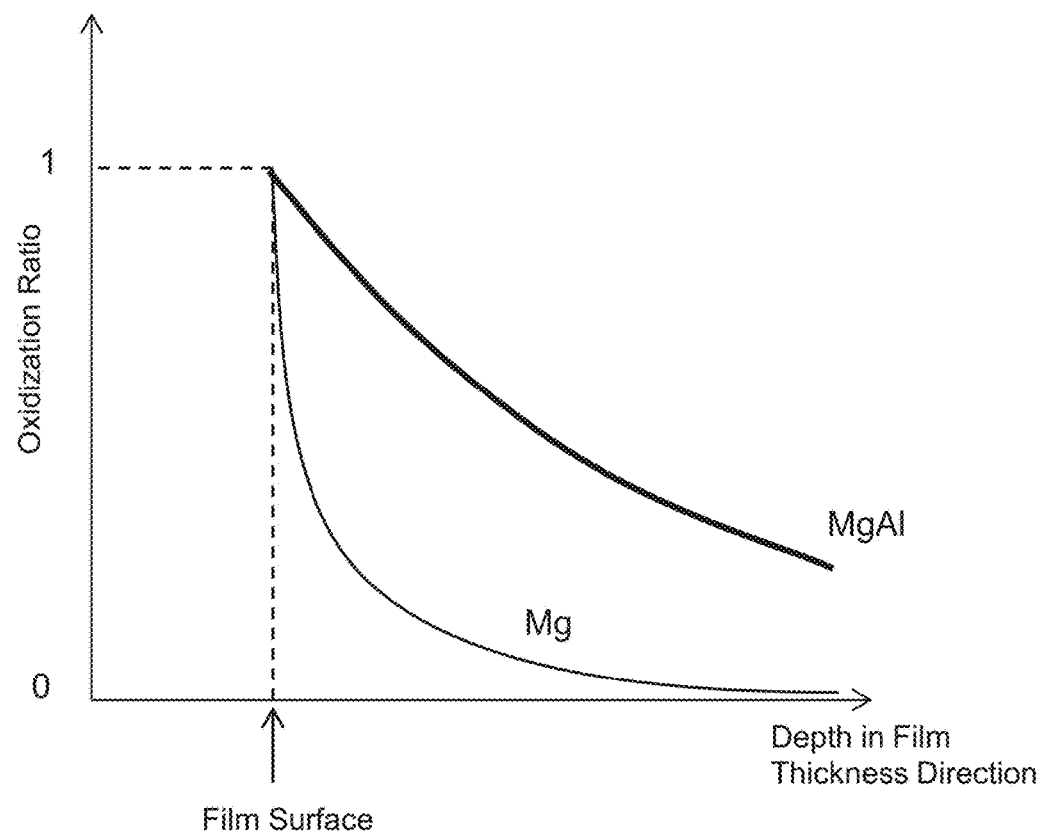
FIG. 2 is a schematic view showing an oxidation state in the barrier layer.

FIG. 2 schematically shows the progress of oxidization in the barrier layer. Both a Mg film and a MgAl film are completely oxidized on the surfaces thereof, but the MG film is less apt to be oxidized in the film. Although not illustrated, an Al film has the same tendency as a Mg film. In other words, there is a similar problem when the barrier layer is formed of $Al_2O_3$. In contrast, a MgAl film is less apt to form passivity in an oxygen atmosphere and oxidization easily progresses to the inside of the film. In the present embodiment, which uses a MgAl film, it is easy to control the degree of oxidization of barrier layer 23 in the film thickness direction, and the variation in the electric resistance can be reduced.

Figure 3A:
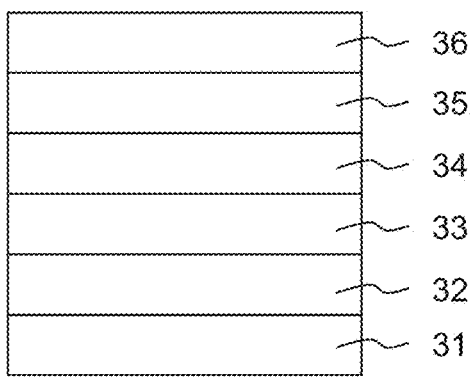
FIGS. 3A to 3C are schematic views showing a manufacturing process of a MTJ of Examples.
Figure 3B:
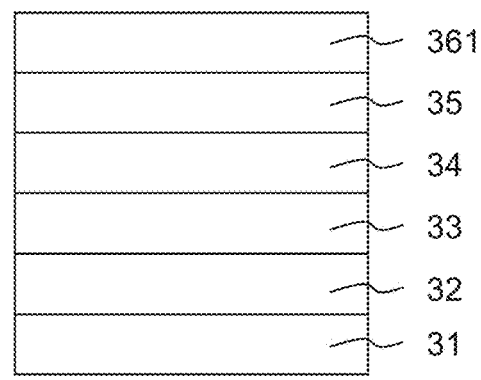
Figure 3C:
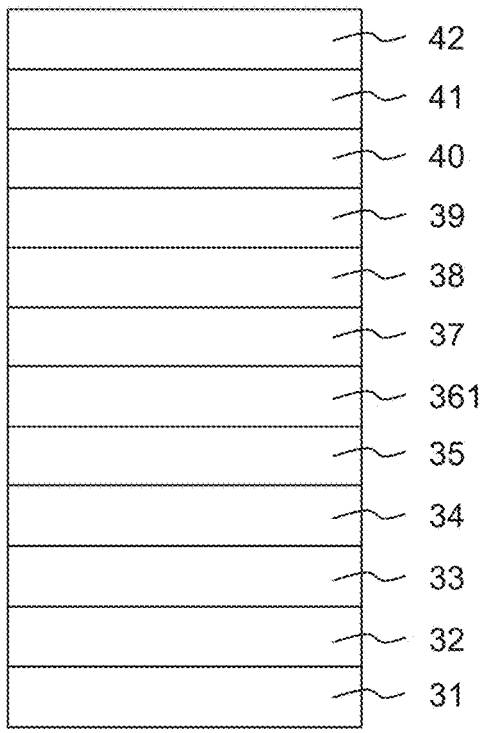

Next, some Examples will be described. In each Example, MTJ 2 was manufactured according to the method shown in FIG. 3. Specifically, as shown in FIG. 3A, poly-crystalline electrode film 32 that simulates lower lead 3, CoFeB layer 33, CoFe layer 34, Mg film 35 and MgAl film 36 (an alloy layer) are sequentially formed on wafer 31, which is a substrate. CoFeB layer 33 and CoFe layer 34 are metal layers to be formed into magnetization free layer 24. CoFeB layer 33 corresponds to second magnetization free layer 24b in the embodiment, and CoFe layer 34 corresponds to first magnetization free layer 24a in the embodiment. CoFeB layer 33 is amorphous at this stage. MgAl film 36 is formed by causing an inert gas, such as argon gas, to collide against a Mg target and an Al target at the same time. Mg film 35 having a film thickness of about 0.4 to 1 nm may be formed between CoFe layer 34 and MgAl film 36 in order to increase the MR ratio. Next, as shown in FIG. 3B, the wafer is housed in an oxidization chamber and an oxidization process is carried out. MgAl film 36 is oxidized and barrier layer 361 that consists of MgAlO is formed in this process. Next, as shown in FIG. 3C, CoFe layer 37, CoFeB layer 38, Ru layer 39, CoFe layer 40 and anti-ferromagnetic layer 41 that is formed of IrMn are formed on barrier layer 361. Finally, protection layer 42 that consists of Ru and Ta is formed. CoFe layer 37, CoFeB layer 38, Ru layer 39, CoFe layer 40 correspond to CoFe layer 22d, second magnetization pinned layer 22c, nonmagnetic intermediate layer 22b and first magnetization pinned layer 22a, respectively, and anti-ferromagnetic layer 41 corresponds to anti-ferromagnetic layer 21. CoFeB layer 38 is amorphous at this stage. Next, annealing is conducted while applying a magnetic field. Annealing temperature was set at or above the blocking temperature of anti-ferromagnetic layer 41 and at or below 300° C. Thus, the magnetization direction of CoFe layer 40 is pinned by anti-ferromagnetic layer 41, and CoFe layer 37 and CoFeB layer 38 are anti-ferromagnetically coupled to CoFe layer 40 via Ru layer 39. The magnetization directions of CoFe layer 37 and CoFeB layer 38 are pinned in a direction anti-parallel to the magnetization direction of CoFe 40. In addition, during the annealing, CoFeB layer 33 is changed into a crystalline structure and CoFeB layer 33 is changed into a crystalline structure having an atom arrangement that is continuous with CoFe layer 37. Thus, magnetization free layer 24 and magnetization pinned layer 22 are formed. MTJs of Comparative Examples were manufactured according to the same process as the process of Examples except for the manufacturing process of barrier layer 361.

The composition (atomic percent) of the magnetic layers (CoFeB layers 33, 38) above and under MgAl film 36 in Embodiments or above and under a Mg film in Comparative Examples were $Co_{17}Fe_{59}B_{24}$. In addition, the composition (atomic percent) of anti-ferromagnetic layer 41 was Ir23Mn77. It should be noted that magnetization free layer 24 was formed on the side of the substrate in Examples, but magnetization pinned layer 22 may be formed on the side of the substrate, as shown in FIG. 1. In other word, magnetization pinned layer 22 and magnetization free layer 24 may be arranged on any one of both sides of barrier layer 23 as long as they interpose barrier layer 23 from both sides in the Z direction.

EXAMPLE 1

A plurality of MTJs were prepared with oxygen exposure as a parameter, and a relationship between oxygen exposure and RA was measured. RA is a product of electric resistance R of a MTJ and area A of a cross section of the element through which the sense current flows, indicating one of characteristics of a magnetoresistive element. The target value of RA is determined for each product to which a magnetoresistive element is incorporated, such as a magnetic sensor, and RA is usually required to fall within a predetermined range for each product. Accordingly, the RA of a magnetoresistive element is required to be less variable or less sensitive to oxygen exposure.

Figure 4:
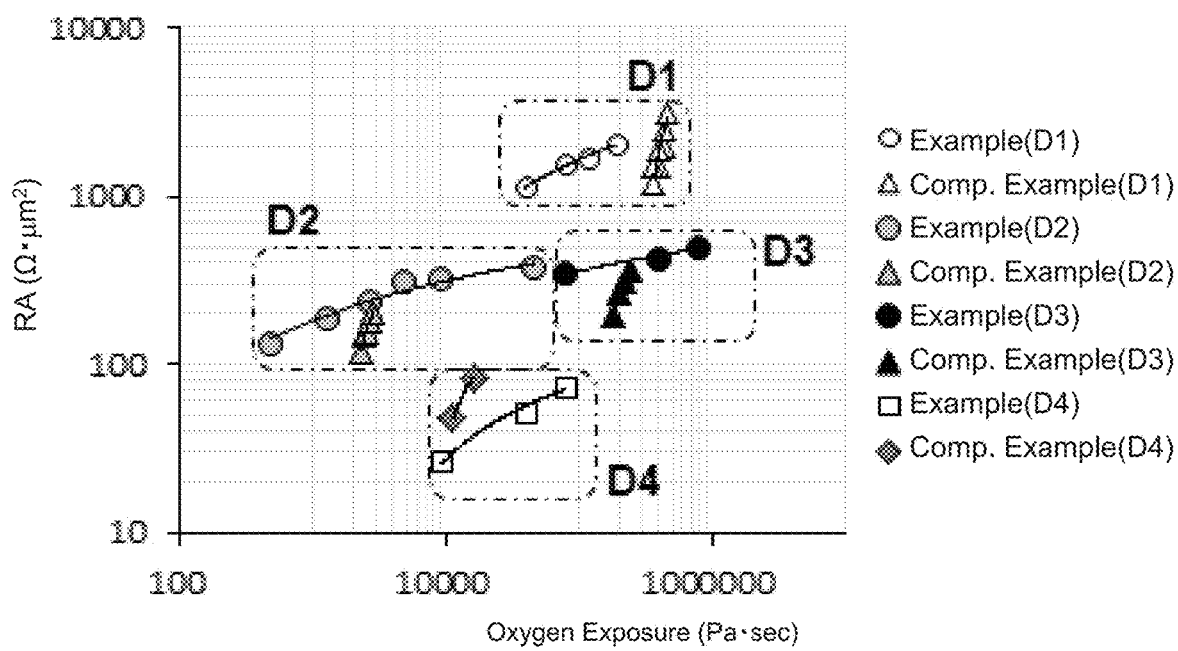
FIG. 4 is a graph showing a relationship between oxygen exposure and RA.

FIG. 4 shows a relationship between oxygen exposure and RA in Examples and Comparative Examples. Oxygen exposure is defined to be oxidization pressure in the oxidization chamber (Pa)×exposure time (sec). Denoting RA by y and denoting oxygen exposure by x, a relationship between x and y was approximated by the formula: $y=\alpha \times \ln(x)+\beta$. Gradient α indicates sensitivity of Ra to oxygen exposure. The larger α is, the larger is the sensitivity of RA to oxygen exposure, i.e., the variation in the element electric resistance tends to increase. β is a constant. Since α depends on the absolute value of RA, evaluation was made for four regions D1 to D4 shown in FIG. 3. The value of α for each region is shown in Table 1. Denoting α of MgO by αMgO and denoting α of MgAlO by αMgAlO, a ratio αMgAlO/αMgO for each region D1 to D4 is shown in Table 2. In each region, αMgAlO/αMgO was 21% or less. In other words, MgAlO was found to be less sensitive to the change of oxidization condition in a wide area of RA ranging from the order of $1\times10^1$ to the order of $1\times10^3$.

TABLE 1

| | Film Thickness of MgAl Firm or Mg Film (nm) | Atomic Percent of Al | α |
| --- | --- | --- | --- |
| Example (D1) | 2.5 | 40 | 564 |
| Comp. Example (D1) | 2.6 | 0 | 6979 |
| Example (D2) | 2.2 | 38 | 56 |
| Comp. Example (D2) | 2.1 | 0 | 381 |
| Example (D3) | 2.2 | 58 | 61 |
| Comp. Example (D3) | 2.1 | 0 | 565 |
| Example (D4) | 1.9 | 35 | 21 |
| Comp. Example (D4) | 1.7 | 0 | 98 |

TABLE 2

| | D1 | D2 | D3 | D4 |
| --- | --- | --- | --- | --- |
| αMgAlO/αMgO | 0.08 | 0.15 | 0.11 | 0.21 |

EXAMPLE 2

Figure 5:
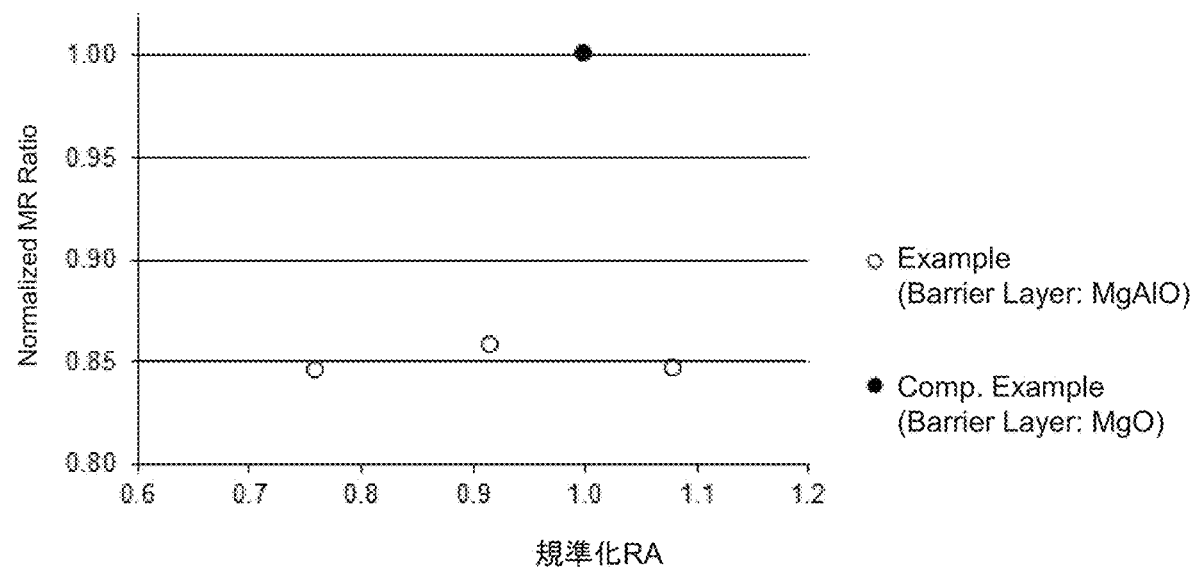
FIG. 5 is a graph showing a relationship between a normalized RA and a normalized MR ratio.

FIG. 5 shows a relationship between a normalized RA and a normalized MR ratio. In FIG. 5, RA and MR ratio of Examples (barrier layer 361 is formed of MgAlO) are normalized by setting RA and MR ratio of Comparative Examples (barrier layer 361 is formed of MgO) at 1. RA of Examples and RA of Comparative Example were about the same level. MR ratio of Examples were about 85% of the MR ratio of Comparative Examples. Based on the fact that the MR ratio of a TMR element whose barrier layer is formed of MgO is typically 150 to 200% and that the MR ratio of a TMR element whose barrier layer is formed of $Al_2O_3$ is typically no more than 80%, it was found that, from the viewpoint of MR ratio, the TMR element of Examples whose barrier layer is formed of MgAlO has MR characteristics that enable the TMR element of Examples to be a substitute for conventional TMR element whose barrier layer is formed of MgO.

Figure 6:
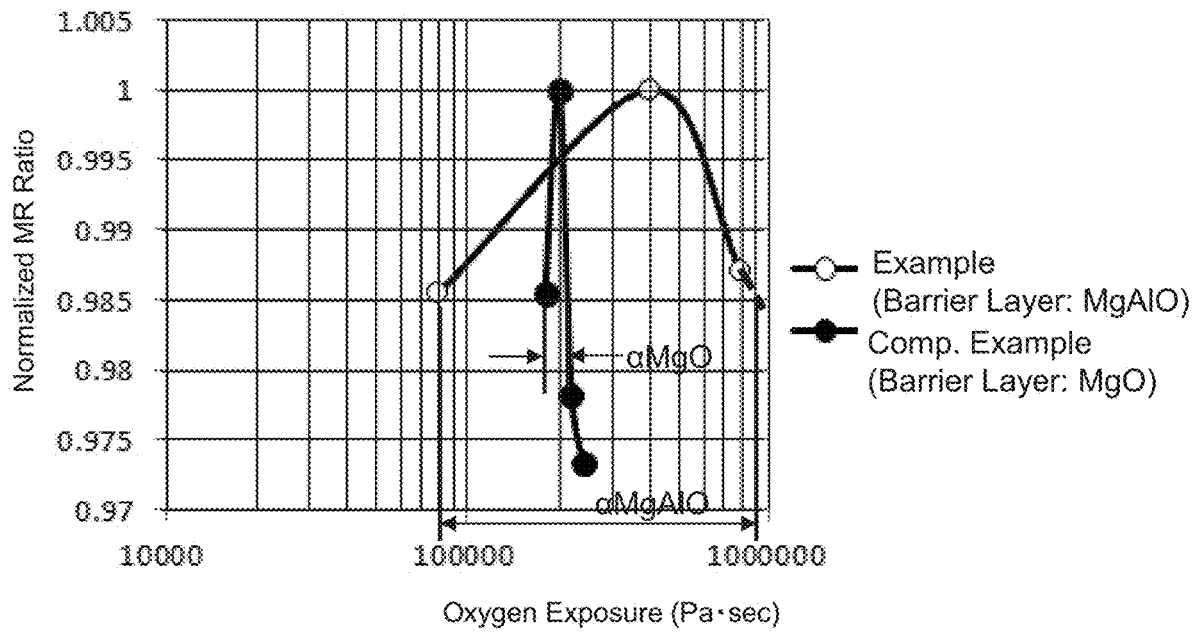
FIG. 6 is a graph showing a relationship between oxygen exposure and the normalized MR ratio.

FIG. 6 shows a relationship between the oxygen exposure and the normalized MR ratio, along with exposure range α in which the MR ratio is 98.5% of the maximum value or more. αMgO denotes range α for Comparative Examples and αMgAlO denotes range α for Examples. Since αMgAlO=720000 (Pa·sec), and αMgO=30000 (Pa·sec), αMgAlO is 20 times or more larger than αMgO. This means that the change in MR ratio to the change in oxygen exposure is much smaller in Examples. In other words, it is found that there is small variation in MR ratio in Examples on the wafer level.

EXAMPLE 3

Figure 7:
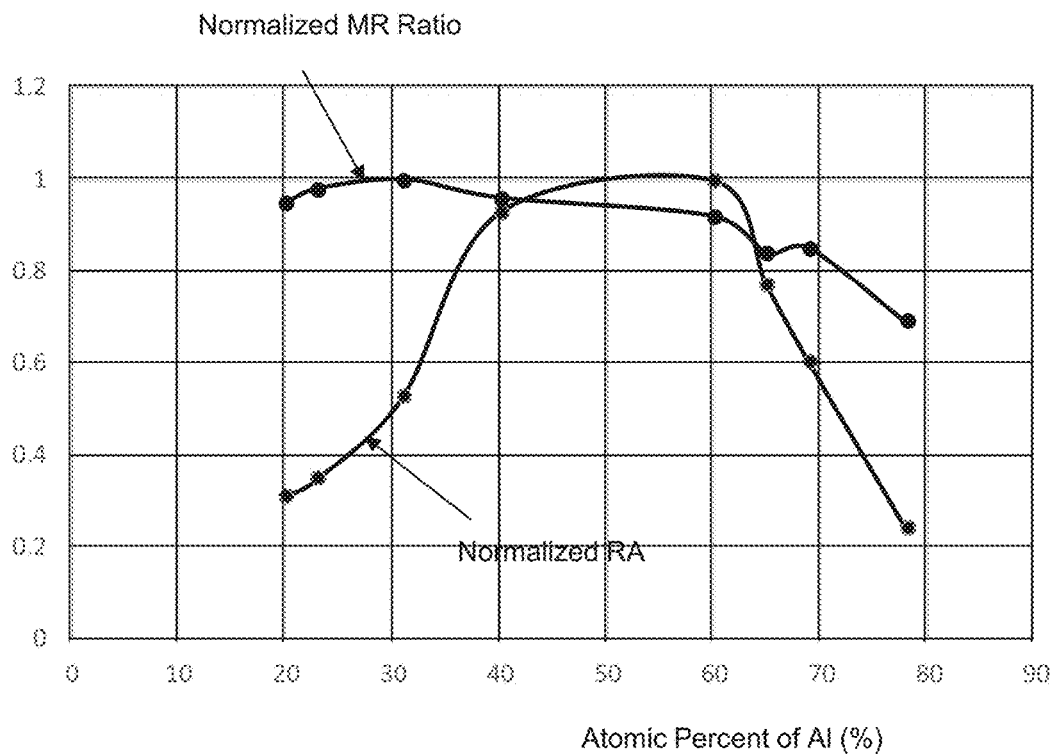
FIG. 7 is a graph showing a relationship between atomic percent of Al and the normalized RA and between the atomic percent of Al and the normalized MR ratio.

A preferable range of the ratio (atomic percent) of Mg and Al in MgAl film 36 was studied. Specifically, a plurality of MTJs having MgAl film 36 that has a film thickness of 1.5 nm and different atomic percents of Al were prepared. In all cases, the same oxidization conditions were used. FIG. 7 shows a relationship between the atomic percent of Al and RA and a relationship between the atomic percent of Al and MR ratio. In the range of atomic percent of Al of 78% at or more, MR ratio tends to be significantly reduced. Thus, from the viewpoint of MR ratio, the atomic percent of Al is preferably 75% at or less. RA is reduced to about 20 to 30% of the maximum value when the atomic percent of Al is about 20% at and about 78% at. In these ranges, many under-oxidized regions or non-oxidized regions are believed to exist in barrier layer 361. The existence of these regions is disadvantageous not only from the viewpoint of MR ratio but also from the viewpoint of reliability, such as reliability for voltage resistance. From the viewpoint of RA (or the existence of non-oxidized regions), the atomic percent of Al is preferably 30% at or more and 75% at or less, and more preferably, 40% at or more and 60% at or less.

(Composition of Barrier Layer 361 in Each Example)

After annealing, Mg elements, Al elements and O elements were uniformly distributed in barrier layer 361. Barrier layer 361 was in a state of a mixture of poly-crystal and amorphism. "Mixture of poly-crystal and amorphism" means a state in which crystallized layers and amorphous layers coexist and the crystallized layers are in a poly-crystalline state. It was found that the MgAlO barrier layer is in a solid phase that is different from the MgO barrier layer (crystallized) or the AlO barrier layer (amorphous). Specifically, the MgAlO barrier layer of the Examples was partially in the form of crystallized oxide and partially in the form of amorphous oxide and was finely oxidized in the depth direction. In the crystallized region, different deposition surfaces were observed depending on the orientation plane of the magnetic seed layer (CoFeB layer 33). In the magnetic seed layer, a plurality types of regions were found, such as a domain having a bcc (001) surface facing the deposition direction and a domain having a distorted (112) surface of a bcc structure that is in contact with barrier layer 361 at angles of about 15°.

EXAMPLE 4

Figure 8:
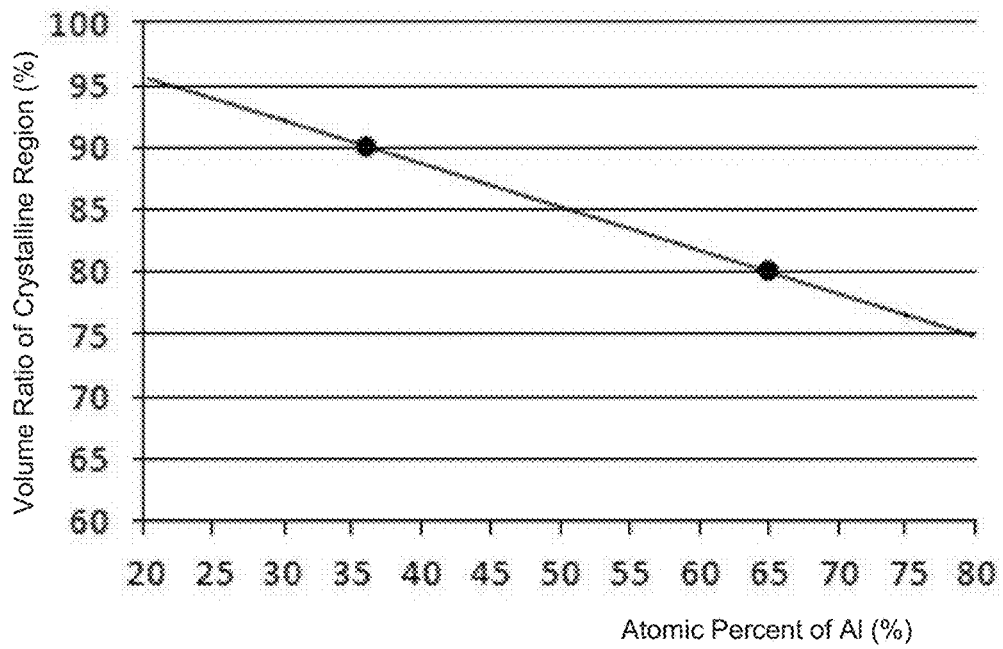
FIG. 8 is a graph showing a relationship between the atomic percent of Al and the volume ratio of crystallized region.

First, a TEM analysis was carried out on the MTJs of Example 3. When the atomic percent of Al was 65%, about 80% of the total volume of barrier layer 361 was crystallized regions. When the atomic percent of Al was 35%, about 90% of the total volume of barrier layer 361 was crystallized regions. FIG. 8 shows a relationship between the atomic percent of Al and the volume ratio of the crystallized regions. From the graph, it is found that ratio of amorphous layers depends on the composition (atomic percent) of Mg and Al.

Figure 9:
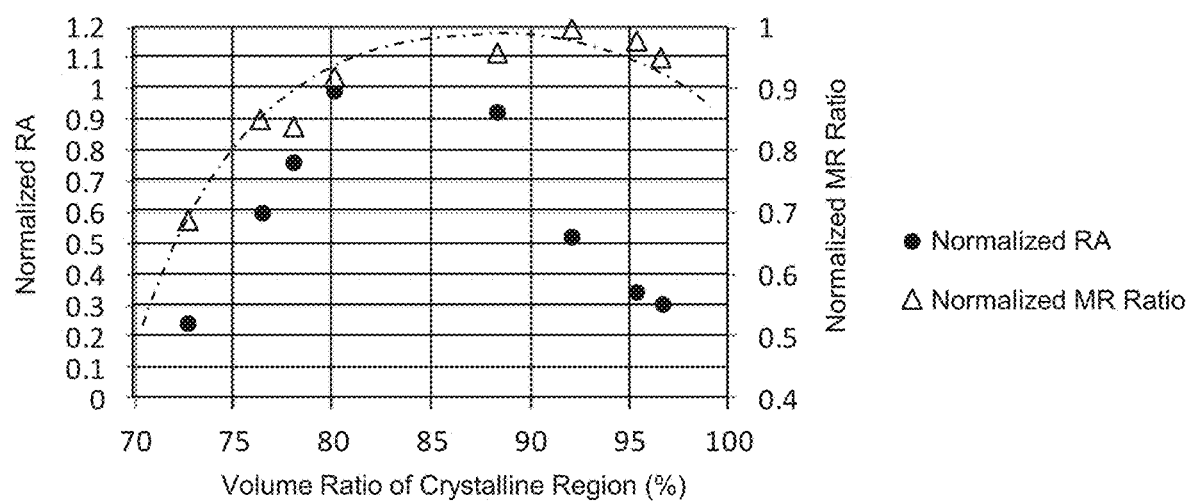
FIG. 9 is a graph showing a relationship between the volume ratio of the crystallized region and the normalized RA and between the volume ratio of the crystallized region and the normalized MR ratio.

Next, MTJs with different atomic percent of Al, and accordingly with different volume ratios of the crystallized regions, were prepared and a relationship between the volume ratio of the crystallized regions and the MR ratio and a relationship between the volume ratio of the crystallized regions and RA were obtained. The results are shown in FIG. 9. When the volume ratio of the crystallized regions is less than 75%, the MR ratio is sharply reduced. Especially, RA was significantly reduced in the range of a large volume ratio of the crystallized regions and in the range of a small volume ratio of the crystallized regions, and a high RA was obtained between these ranges. This suggests, as mentioned above, that non-oxidized regions remain in barrier layer 361 in the ranges of large and small volume ratios of the crystallized regions. Accordingly, the volume ratio of the crystallized regions in barrier layer 361 is preferably 75% or more and 90% or less.

Figure 10:
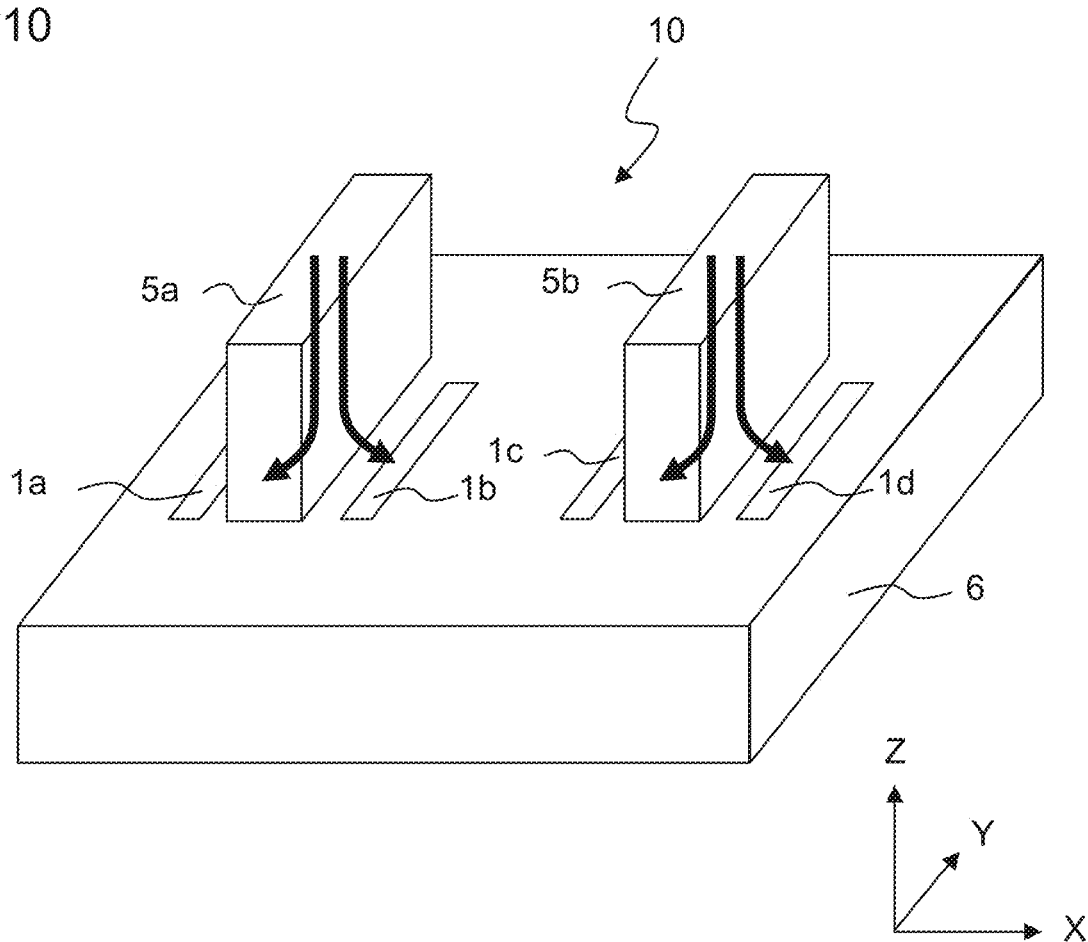
FIG. 10 is a schematic perspective view of a Z-axis magnetic sensor.

Next, an example of a magnetic sensor that utilizes the magnetoresistive element mentioned above will be described. The magnetoresistive element according to the present invention may be applied to any type of a magnetic sensor that detects a magnetic field. Examples of the magnetic sensor include not only a sensor for detecting a magnetic field itself, such as a geomagnetic field, but also a current sensor for measuring a current by detecting a magnetic field that is induced by a current that flows in a current line. FIG. 10 shows an example of so-called Z-axis sensor 10 that detects a magnetic field that is perpendicular to the multi-layers of a magnetoresistive element, but the present invention is not limited to this. Magnetic sensor 10 has substrate 6 and first to fourth magnetoresistive elements 1a to 1d that are arranged in the X direction on substrate 6. First to fourth magnetoresistive elements 1a to 1d are arranged in a plane that includes the X direction and the Y direction and detects a magnetic field in the X direction. First to fourth magnetoresistive elements 1a to 1d have substantially rectangular shapes with longer dimensions in the Y direction than in the X direction, as viewed in the Z direction. First to fourth magnetoresistive elements 1a to 1d are interconnected to each other in a bridge circuit (not shown), allowing magnetic sensor 10 to detect an external magnetic field.

First yoke 5a that is formed of a soft magnetic body is arranged between first magnetoresistive element 1a and second magnetoresistive element 1b, and second yoke 5b that is formed of a soft magnetic body is arranged between third magnetoresistive element 1c and fourth magnetoresistive element 1d. First and second yoke 5a, 5b are formed of NiFe or the like. First yoke 5a is adjacent to first and second magnetoresistive elements 1a, 1b in the X direction, and second yoke 5b is adjacent to third and fourth magnetoresistive elements 1c, 1d in the X direction. First and second yokes 5a, 5b guide a magnetic flux that is applied in third direction Z and that is absorbed by yokes 5a, 5b toward the magnetic field detecting direction of magnetoresistive elements 1a to 1d, that is the X direction. When an external magnetic field is applied to magnetic sensor 10 in third direction Z, the magnetic flux is absorbed by first and second yokes 5a, 5b (shown by the bold arrows in the figure) and is bent in the X direction.

A magnetic field whose component in the X direction is increased by the magnetic flux passing through first yoke 5a is applied to first and second magnetoresistive elements 1a, 1b, and magnetic field whose component in the X direction is increased by the magnetic flux passing through second yoke 5b is applied to third and fourth magnetoresistive elements 1c, 1d. Therefore, magnetic sensor 10 can detect a magnetic field component in the Z direction more efficiently than a magnetic sensor that does not have first and second yokes 5a, 5b.

Although a certain preferred embodiment(s) of the present invention has (have) been shown and described in detail, it should be understood that various changes and modifications may be made without departing from the spirit or scope of the appended claims.

What is claimed is:

1. A magnetoresistive element comprising:
   a magnetization free layer whose magnetization direction changes depending on an external magnetic field;
   a magnetization pinned layer whose magnetization direction is pinned against the external magnetic field; and
   a barrier layer that is positioned between the magnetization free layer and the magnetization pinned layer and that exhibits a magnetoresistive effect, wherein
   the barrier layer is an oxide of an alloy that includes Mg and Al, and the barrier layer includes a crystalline region and a non-crystalline region, and
   an atomic percent of Al in the alloy is 30% or more and 75% or less.

2. The magnetoresistive element according to claim 1, wherein the alloy consists of Mg and Al.

3. The magnetoresistive element according to claim 1, wherein the alloy further includes Zn or Ti or both Zn and Ti.

4. The magnetoresistive element according to claim 1, wherein a volume ratio of the crystalline region in the barrier layer is 75% or more and 90% or less.

5. The magnetoresistive element according to claim 1, wherein an atomic percent of Al in the alloy is 40% or more and 60% or less.

6. The magnetoresistive element according to claim 1, wherein the magnetization free layer and the magnetization pinned layer include Co and Fe and further include at least any one of Si, B, N, and P.

7. A magnetoresistive element comprising:
   a magnetization free layer whose magnetization direction changes depending on an external magnetic field;
   a magnetization pinned layer whose magnetization direction is pinned against the external magnetic field; and
   a barrier layer that is positioned between the magnetization free layer and the magnetization pinned layer and that exhibits a magnetoresistive effect, wherein
   the barrier layer is an oxide of an alloy that includes Mg and Al, and the barrier layer includes a crystalline region and a non-crystalline region,
   the magnetization pinned layer has a multilayer film in which a first magnetization pinned layer, a nonmagnetic intermediate layer, a second magnetization pinned layer and a CoFe layer that faces the barrier layer are sequentially stacked, and
   at least either a portion of the second magnetization pinned layer that is adjacent to the CoFe layer or a portion of the magnetization free layer that is adjacent to the barrier layer is crystalline.

8. A magnetic sensor comprising the magnetoresistive element according to claim 1.

9. A method of manufacturing a magnetoresistive element comprising the steps of:
   forming either a magnetization free layer whose magnetization direction changes depending on an external magnetic field or a metal layer that is to be a magnetization pinned layer whose magnetization direction is pinned against the external magnetic field;
   forming an alloy film that includes Mg and Al above either one of the layers, wherein an atomic percent of Al in the alloy film is 30% or more and 75% or less;
   oxidizing the alloy film in order to form a barrier layer that has a magnetoresistive effect and that includes a crystalline region and a non-crystalline region;
   forming a remaining one of the magnetization free layer and the metal layer above the barrier layer; and
   pinning the magnetization direction of the metal layer in order to form the magnetization pinned layer.

10. A method of manufacturing a magnetoresistive element comprising the steps of:
    forming either a magnetization free layer whose magnetization direction changes depending on an external magnetic field or a metal layer that is to be a magnetization pinned layer whose magnetization direction is pinned against the external magnetic field;
    forming an alloy film that includes Mg and Al above said either one of the layers;
    oxidizing the alloy film in order to form a barrier layer that has a magnetoresistive effect and that includes a crystalline region and a non-crystalline region;
    forming a remaining one of the magnetization free layer and the metal layer above the barrier layer;
    pinning the magnetization direction of the metal layer in order to form the magnetization pinned layer, wherein
    a CoFe layer is provided between the barrier layer and the metal layer,
    the magnetization free layer and the metal layer are amorphous, and
    a portion of the magnetization free layer that is adjacent to the barrier layer and a portion of the metal layer that is adjacent to the CoFe layer are crystallized by annealing.

* * * * *